(12) United States Patent
Kuriyagawa et al.

(10) Patent No.: US 8,368,077 B2
(45) Date of Patent: Feb. 5, 2013

(54) DISPLAY DEVICE AND MANUFACTURING METHOD THEREOF

(75) Inventors: Takeshi Kuriyagawa, Mobara (JP); Takeshi Noda, Mobara (JP); Takuo Kaitoh, Mobara (JP)

(73) Assignees: Hitachi Displays, Ltd., Chiba (JP); Panasonic Liquid Display Co., Ltd., Hyogo-ken (JP)

( * ) Notice: Subject to any disclaimer, the term of this patent is extended or adjusted under 35 U.S.C. 154(b) by 600 days.

(21) Appl. No.: 12/578,641

(22) Filed: Oct. 14, 2009

(65) Prior Publication Data

US 2010/0096632 A1 Apr. 22, 2010

(30) Foreign Application Priority Data

Oct. 17, 2008 (JP) ................................. 2008-268341

(51) Int. Cl.
*H01L 27/14* (2006.01)
(52) U.S. Cl. .................... 257/72; 257/59; 257/E21.535; 349/43
(58) Field of Classification Search ............. 257/59, 257/72, E21.535; 349/43
See application file for complete search history.

(56) References Cited

U.S. PATENT DOCUMENTS

2002/0004262 A1* 1/2002 Asami et al. .................. 438/166
2007/0045730 A1* 3/2007 Noda et al. .................... 257/344

* cited by examiner

*Primary Examiner* — N Drew Richards
*Assistant Examiner* — Yu-Hsi D Sun
(74) *Attorney, Agent, or Firm* — Antonelli, Terry, Stout & Kraus, LLP.

(57) ABSTRACT

A second insulation layer which is formed by stacking a plurality of layers made of different materials in a mutually contact manner is formed such that the second insulation layer covers a source region and a drain region and also covers a gate electrode from above. A first contact hole which reaches one of the source region and the drain region and a recessed portion which is arranged above the gate electrode but is not communicated with the gate electrode are simultaneously formed on the second insulation layer by dry etching. A first line layer is formed so as to cover the first contact hole. After forming the first line layer, a bottom surface of the recessed portion is etched by dry etching thus forming a second contact hole which reaches the gate electrode in the first and second insulation layers. A second line layer is formed on the second contact hole.

4 Claims, 7 Drawing Sheets

DISPLAY DEVICE AND MANUFACTURING METHOD THEREOF

The present application claims priority from Japanese applications JP 2008-268341 filed on Oct. 17, 2008, the content of which is hereby incorporated by reference into this application.

BACKGROUND OF THE INVENTION

1. Field of the Invention

The present invention relates to a display device and a manufacturing method of the display device.

2. Description of the Related Art

As a TFT (Thin Film Transistor) substrate which is used for forming a liquid crystal panel, there has been known a TFT substrate which adopts the bottom gate structure in which a gate of each thin film transistor is positioned below a source and a drain of the thin film transistor. For protecting the transistor, it is desirable to form both an $SiO_2$ layer and an SiN layer on the transistor. In stacking the $SiO_2$ layer and the SiN layer continuously, to etch the respective layers continuously, it is necessary to adopt a dry etching method. However, when the dry-etching method is adopted, the source and the drain are etched before etching reaches the gate. On the other hand, when a wet-etching method is adopted, since the etching advances isotropically, side etching occurs. Further, when lines are formed by etching the $SiO_2$ layer and, thereafter, the SiN layer is formed and etched, a surface of the $SiO_2$ layer is contaminated with SiN.

SUMMARY OF THE INVENTION

It is an object of the present invention to provide a display device having a high reliability and a method for efficiently manufacturing the display device.

(1) The present invention is directed to a manufacturing method of a display device including a step of forming thin film transistors on a substrate, the step of forming the thin film transistors comprising the steps of forming gate electrodes, forming a first insulation layer formed of at least one layer such that the first insulation layer includes portions which cover the gate electrodes and portions which do not overlap with the gate electrodes, forming source regions and drain regions on the first insulation layer such that each source region and each drain region are arranged at positions which avoid an area above at least a portion of the gate electrode, forming a second insulation layer which is formed by stacking a plurality of layers made of different materials from each other in a mutually contact manner such that the second insulation layer covers the source regions and the drain regions and covers the gate electrodes from above, forming first contact holes each of which reaches one of the source regions and the drain regions and recessed portions which are formed above the gate electrodes but do not reach the gate electrodes on the second insulation layer, forming first line layers such that each first line layer covers each first contact hole, forming second contact holes which reach the gate electrodes in the first and the second insulation layers by etching bottom surfaces of the recessed portions after forming the first line layers, and forming second line layers in the second contact holes. According to the present invention, the recessed portions are formed above the gate electrodes simultaneously with the formation of the first contact holes and hence, the influence of the formation of the contact holes exerted on the source regions and the drain regions can be reduced. Further, the first contact holes and the recessed portions are formed by dry etching and hence, side etching does not occur. Further, although the second insulation layer is formed of the plurality of layers made of different materials from each other, the plurality of layers are formed by stacking in a mutually contact manner and hence, it is possible to prevent the contamination of surfaces of the plurality of layers.

(2) In the manufacturing method of the display device according to (1), the step of forming the second insulation layer may include a step of forming a silicon oxide film and a step of forming a silicon nitride film on the silicon oxide film which are performed continuously.

(3) In the manufacturing method of the display device according to (2), the step of forming the second insulation layer may be performed without exposing the silicon oxide film to the atmosphere.

(4) In the manufacturing method of the display device according to anyone of (1) to (3), the step of forming the thin film transistors further may include a step of forming a third insulation layer in regions arranged on the second insulation layer and adjacent to at least the first line layers before forming the second contact holes.

(5) In the manufacturing method of the display device according to (4), the third insulation layer may be not formed in the recessed portions.

(6) In the manufacturing method of the display device according to (4), the third insulation layer may be formed such that the third insulation layer reaches an inner surface of the recessed portion while obviating at least a portion of the bottom surface of the recessed portion.

(7) The present invention is directed to a display device which includes a substrate, gate electrodes which are formed on the substrate, a first insulation layer which is formed on the substrate and is formed of at least one layer such that the first insulation layer includes portions which cover the gate electrodes and portions which do not overlap with the gate electrodes, source regions and drain regions which are formed on the first insulation layer such that the source region and the drain region are arranged at positions which avoid an area above at least a portion of the gate electrode, a second insulation layer which is formed by stacking a plurality of layers made of different materials from each other in a mutually contact manner such that the second insulation layer covers the gate electrodes from above and covers the source regions and the drain regions, and in which first contact holes each of which reaches one of the source regions and the drain regions are formed, and first line layers which are formed such that each first line layer covers each first contact hole, wherein second contact holes which reach the gate electrodes are formed in the first and the second insulation layers, a stepped portion is formed on an inner surface of the second contact hole, and a second line layer is formed on the inner surface of the second contact hole such that the second line layer passes over the stepped portion.

DESCRIPTION OF THE PREFERRED EMBODIMENTS

Hereinafter, an embodiment of the present invention is explained in conjunction with drawings.

Figure 1:
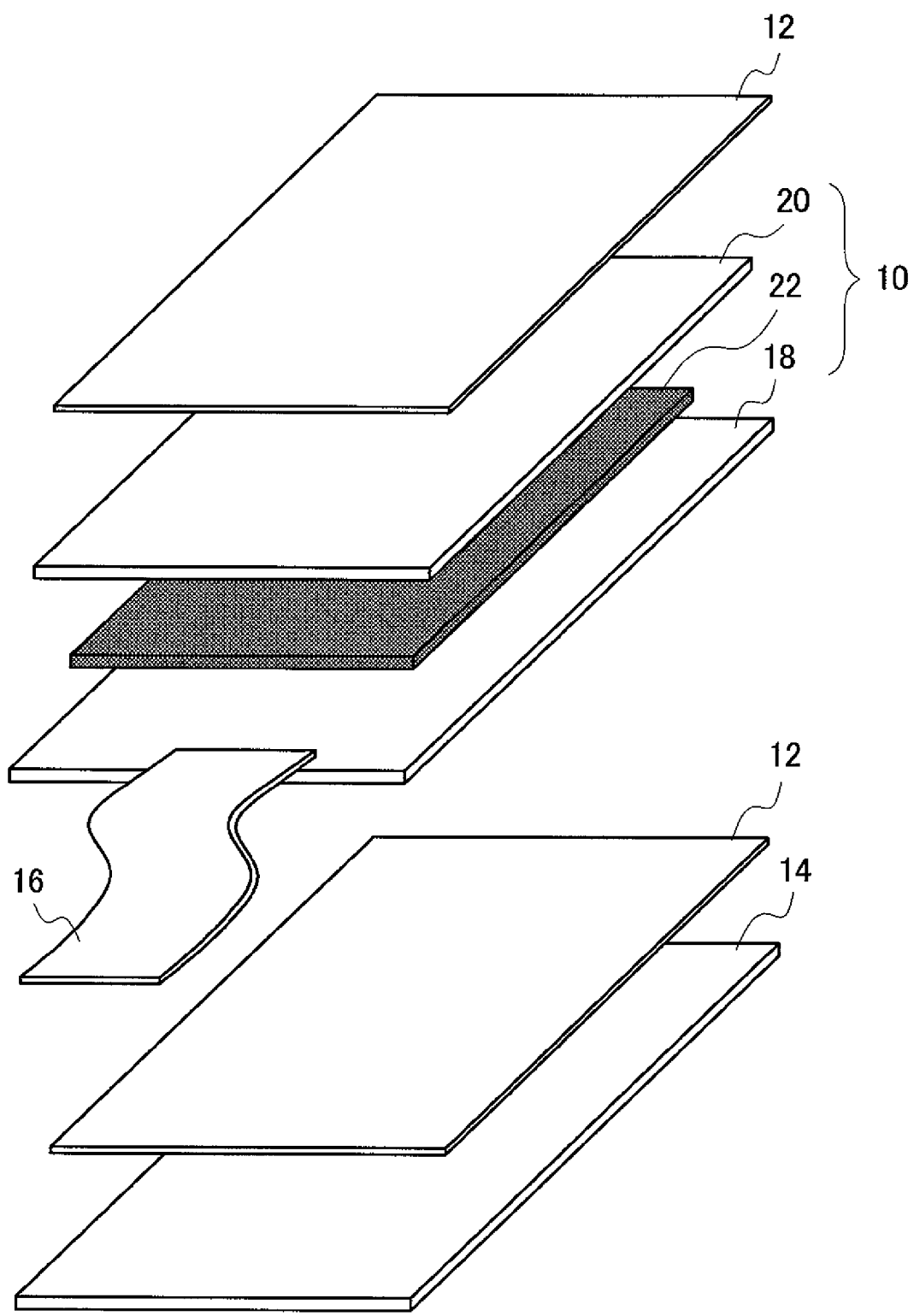
FIG. 1 is an exploded perspective view showing a display device according to an embodiment of the present invention.

FIG. 1 is an exploded perspective view showing a display device according to an embodiment of the present invention. The explanation is made with respect to a case where the display device is a liquid crystal display device. The liquid crystal display device includes a liquid crystal panel 10. A polarizer 12 is arranged on both surfaces of the liquid crystal panel 10 respectively. The liquid crystal display device includes a backlight 14. One polarizer 12 is interposed between the liquid crystal panel 10 and the backlight 14. A flexible printed circuit board 16 is mounted on the liquid crystal panel 10.

The display device includes a substrate 18 and a second substrate 20 which faces the substrate 18 in an opposed manner, and a liquid crystal 22 is interposed between both substrates 18, 20. The substrate 18, the second substrate 20 and the liquid crystal 22 constitute parts of the liquid crystal panel 10. The substrate 18 is a TFT (Thin Film Transistor) substrate (or array substrate) which includes thin film transistors, pixel electrodes, lines and the like. The second substrate 20 is a color filter substrate.

A driving method of the liquid crystal panel 10 is not limited to an IPS (In Plane Switching) method. That is, other driving methods such as a TN (Twisted Nematic) method or a VA (Vertical Alignment) method may be also adopted, and electrodes and lines are formed in conformity with the adopted method. The display device is not limited to the liquid crystal display device, and the present invention is also applicable to an electroluminescence display device.

FIG. 2 to FIG. 12 are views for explaining a manufacturing method of a display device to which the present invention is applied. In this embodiment, the manufacturing method includes steps for forming thin film transistors on the substrate 18.

The substrate 18 includes a base layer 24. The base layer 24 is made of glass. A background layer 26 is formed on the base layer 24. The background layer 26 is formed of an insulation film made of SiN or the like.

Figure 2:
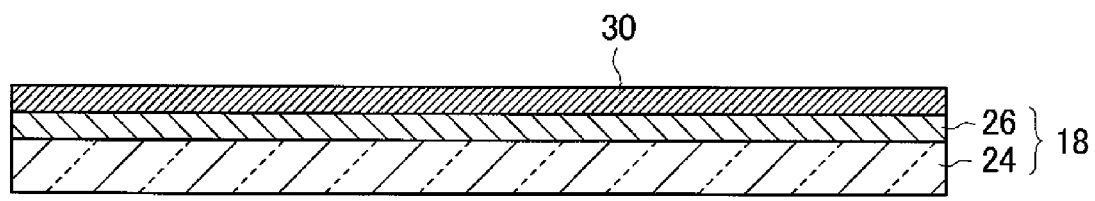
FIG. 2 is a view for explaining a manufacturing method of the display device to which the present invention is applied.

Gate electrodes 28 are formed on the substrate 18 (the background layer 26). For example, the gate electrodes 28 are formed by forming a metal film 30 as shown in FIG. 2 and by etching the metal film 30 (see FIG. 3). In etching the metal film 30, an etching resist (not shown in the drawing) which is formed by patterning using photolithography may be used.

A first insulation layer 32 is formed on the substrate 18 (background layer 26). The first insulation layer 32 is formed such that the first insulation layer 32 includes portions which cover the gate electrodes 28 (for example, portions which are brought into contact with the gate electrodes 28) and portions which do not overlap with the gate electrodes 28 (portions where projection surfaces of the portions on the substrate 18 do not overlap with the gate electrodes 28). The first insulation layer 32 is formed of at least one layer. For example, the first insulation layer 32 may be formed of a plurality of layers including a silicon oxide film and a silicon nitride film.

Source regions 34 and drain regions 36 are formed on the first insulation layer 32. The source region 34 and the drain region 36 are formed on the first insulation layer 32 such that these regions 34, 36 sandwich a region above one gate electrode 28 (on left side in FIG. 4), and are formed at a position where the source region 34 and the drain region 36 avoid a region above at least a portion (the whole portion in FIG. 4) of another gate electrode 28 (on a right side in FIG. 4).

Figure 3:
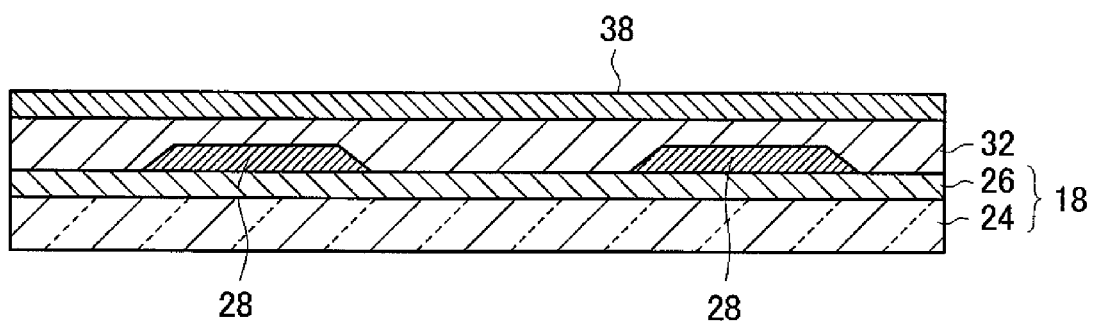
FIG. 3 is a view for explaining a manufacturing method of the display device to which the present invention is applied.
Figure 4:
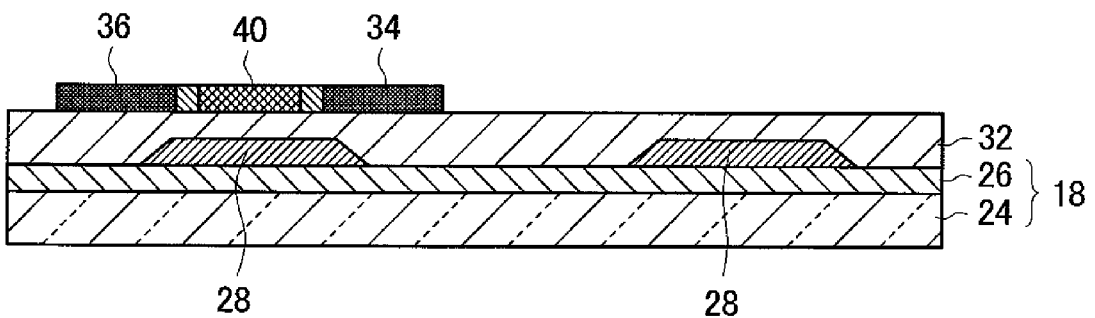
FIG. 4 is a view for explaining a manufacturing method of the display device to which the present invention is applied.

The source region 34 and the drain region 36 are formed by forming a semiconductor thin film 38 is formed as shown in FIG. 3, patterning the semiconductor thin film 38 as shown in FIG. 4, and implanting ions to the patterned semiconductor thin film 38. Here, the patterning may be performed by using an etching resist which has been formed by using a photolithography (not shown in the drawing). The source region 34 and the drain region 36 respectively include a region of low impurity concentration on a channel-region-40 side thereof.

Figure 5:
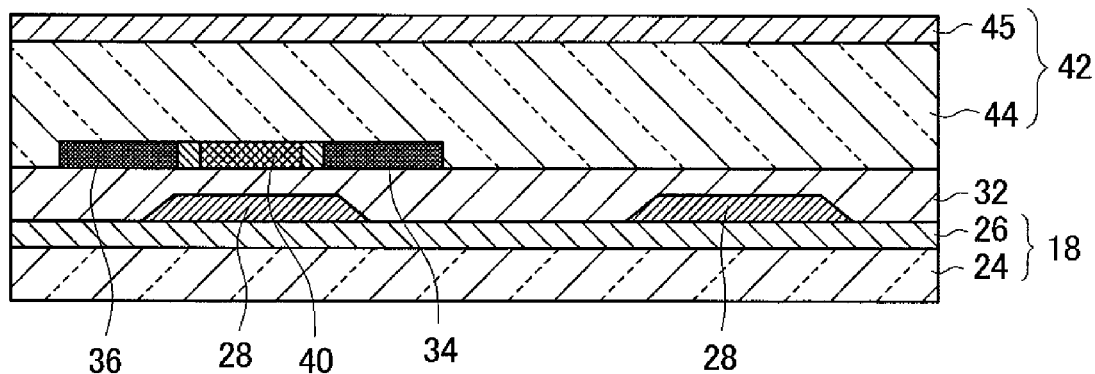
FIG. 5 is a view for explaining a manufacturing method of the display device to which the present invention is applied.

As shown in FIG. 5, a second insulation layer 42 is formed. The second insulation layer 42 is constituted of a plurality of layers which are made of materials different from each other (for example, a silicon oxide film 44 which constitutes a lower layer and a silicon nitride film 45 which constitutes an upper layer) and are brought into contact with each other. The silicon oxide film 44 exhibits electric insulation property higher than electric insulation property of the silicon nitride film 45, while the silicon nitride film 45 exhibits water-barrier property higher than water-barrier property of the silicon oxide film 44 and hence, the respective films are complementary to each other in their properties.

The second insulation layer 42 is formed so as to cover the source regions 34 and the drain regions 36 (the second insulation layer 42 is brought into contact with these regions 34, 36) and cover an area above the gate electrodes 28 (projection surface of the second insulation layer 42 on the substrate 18 overlapping with the gate electrodes 28). The silicon oxide film 44 and the silicon nitride film 45 are continuously formed using the same film-forming device without taking out the respective films 44, 45 from a chamber of the film-forming device (without exposing the respective films 44, 45 to the atmosphere). By forming the respective films 44, 45 in such a manner, it is possible to prevent the contamination of a surface of the silicon oxide film 44 which is firstly formed.

Figure 6:
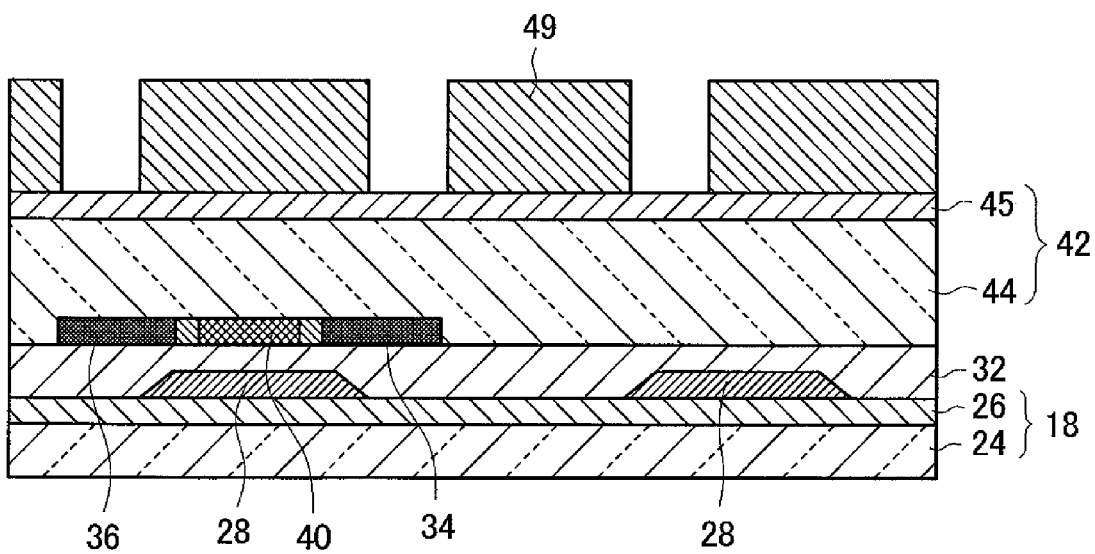
FIG. 6 is a view for explaining a manufacturing method of the display device to which the present invention is applied.

First contact holes 46 and recessed portions 48 are simultaneously formed on the second insulation layer 42 by dry etching. Before etching the second insulation layer 42, an etching resist 49 having a pattern shown in FIG. 6 is formed, and the dry etching is performed using the etching resist 49 as a mask.

Figure 7:
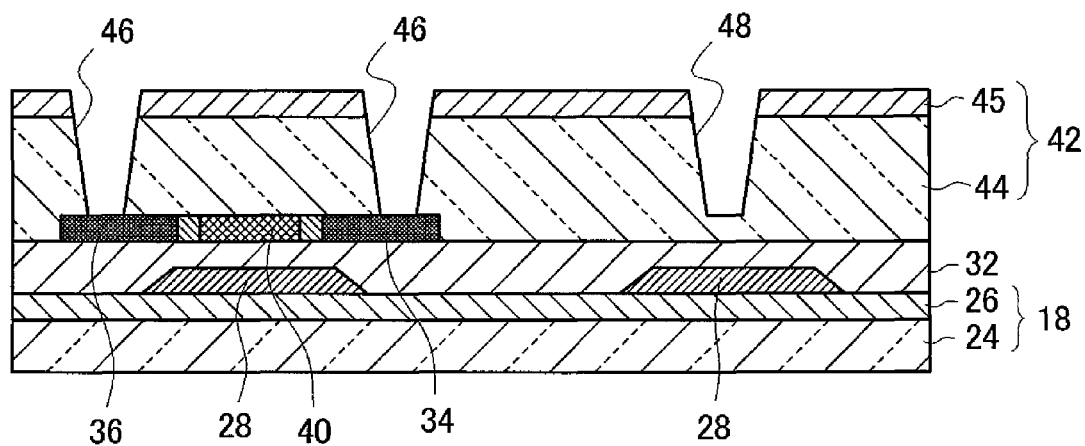
FIG. 7 is a view for explaining a manufacturing method of the display device to which the present invention is applied.

As shown in FIG. 7, the first contact holes 46 are formed such that the first contact hole 46 reaches one of the source region 34 and the drain region 36. The first contact holes 46 which reach the source regions 34 and other first contact holes 46 which reach the drain regions 36 are formed. The recessed portions 48 are formed such that the recessed portions 48 are positioned above the gate electrode 28 but are not communicated with the gate electrodes 28. In other words, at a point of time that the first contact holes 46 reach the source regions 34 and the drain regions 36 respectively, the dry etching is stopped. This can reduce the influence of the dry etching on the source regions 34 and the drain regions 36 as much as possible.

Figure 8:
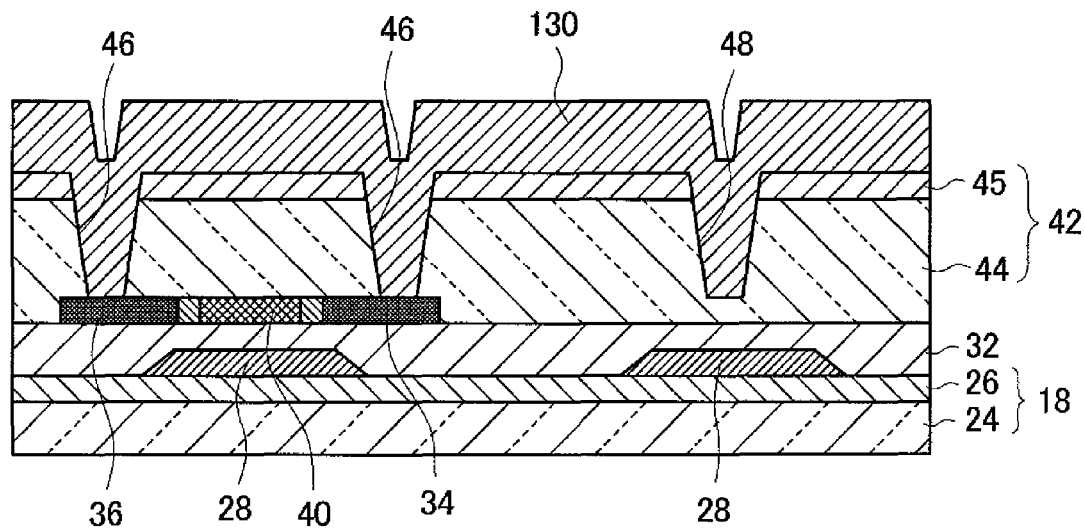
FIG. 8 is a view for explaining a manufacturing method of the display device to which the present invention is applied.
Figure 9:
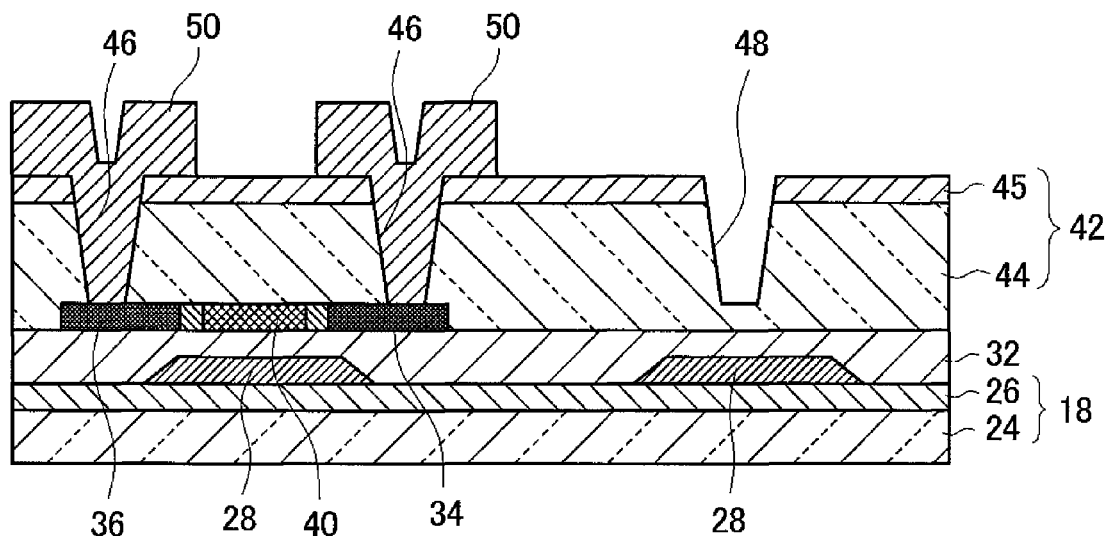
FIG. 9 is a view for explaining a manufacturing method of the display device to which the present invention is applied.

Next, first line layers 50 are formed in a state that the first line layers 50 respectively cover (bury) the first contact holes 46. For example, as shown in FIG. 8, a metal film 130 is continuously formed on a surface of the second insulation layer 42, inner surfaces of the first contact holes 46, surfaces of the source regions 34 and surfaces of the drain regions 36 which are exposed from the first contact holes 46, and inner surfaces of the recessed portions 48. Then, as shown in FIG. 9, the first line layers 50 are formed by etching the metal film 130.

Figure 10:
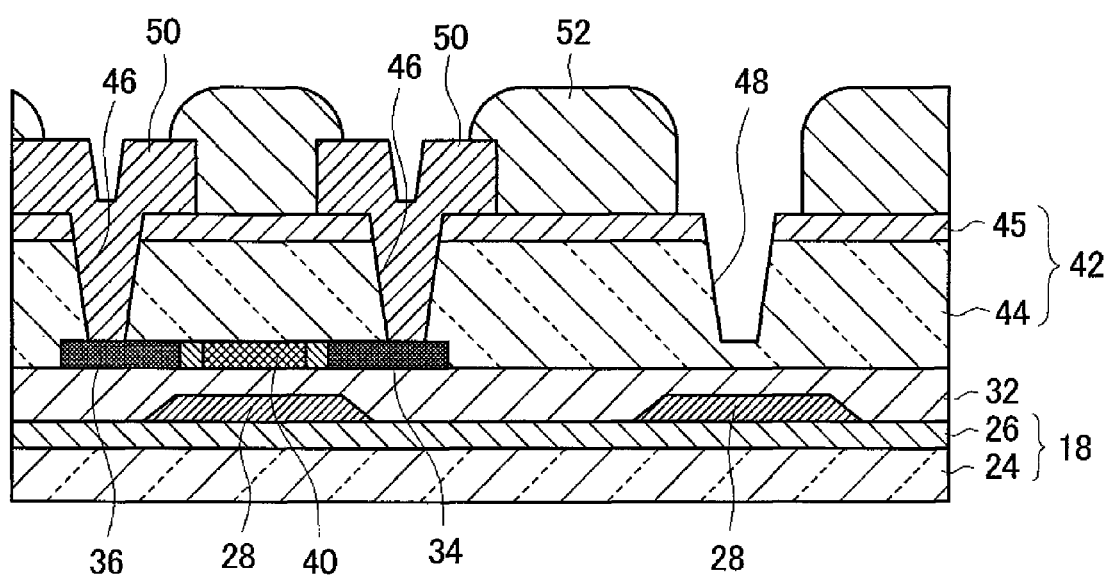
FIG. 10 is a view for explaining a manufacturing method of the display device to which the present invention is applied.

As shown in FIG. 10, a third insulation layer 52 is formed when necessary. The third insulation layer 52 is formed in regions on the second insulation layer 42 adjacent to at least the first line layers 50. The third insulation layer 52 is formed such that the third insulation layer 52 does not enter the recessed portion 48. In FIG. 10, although the second insulation layer 42 is shown flat, in an actual liquid crystal display device, a surface of the second insulation layer 42 has surface irregularities. By forming the third insulation layer 52 made of a liquid material on the second insulation layer 42, it is possible to make an upper surface of the third insulation layer 52 flat. Using an organic material (for example, a resin precursor) which exhibits photosensitivity as the liquid material, the third insulation layer 52 can be patterned by photolithography.

Figure 11:
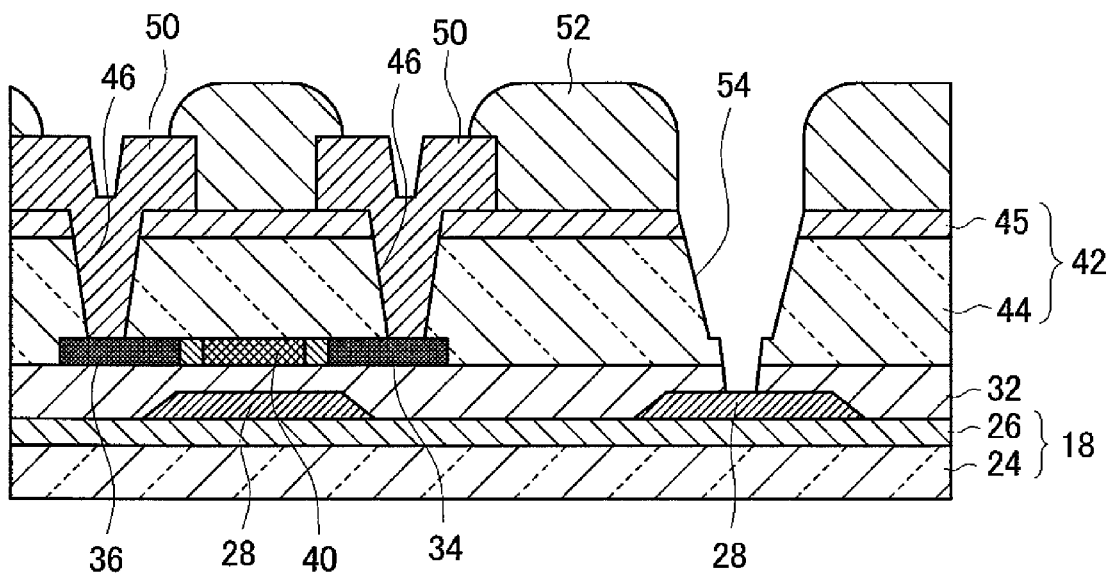
FIG. 11 is a view for explaining a manufacturing method of the display device to which the present invention is applied.

As shown in FIG. 11, a bottom surface of each recessed portion 48 (see FIG. 10) is etched by dry etching. Such dry etching is performed after forming the first line layers 50 and hence, the first line layers 50 function as a mask thus preventing the first contact holes 46 from being further etched.

After forming the first line layers 50 (or after forming the third insulation layer 52 further) in such a manner, the bottom surfaces of the recessed portions 48 are etched by dry etching thus forming second contact holes 54 which reach the gate electrodes 28 in the first and second insulation layers 32, 42.

Figure 12:
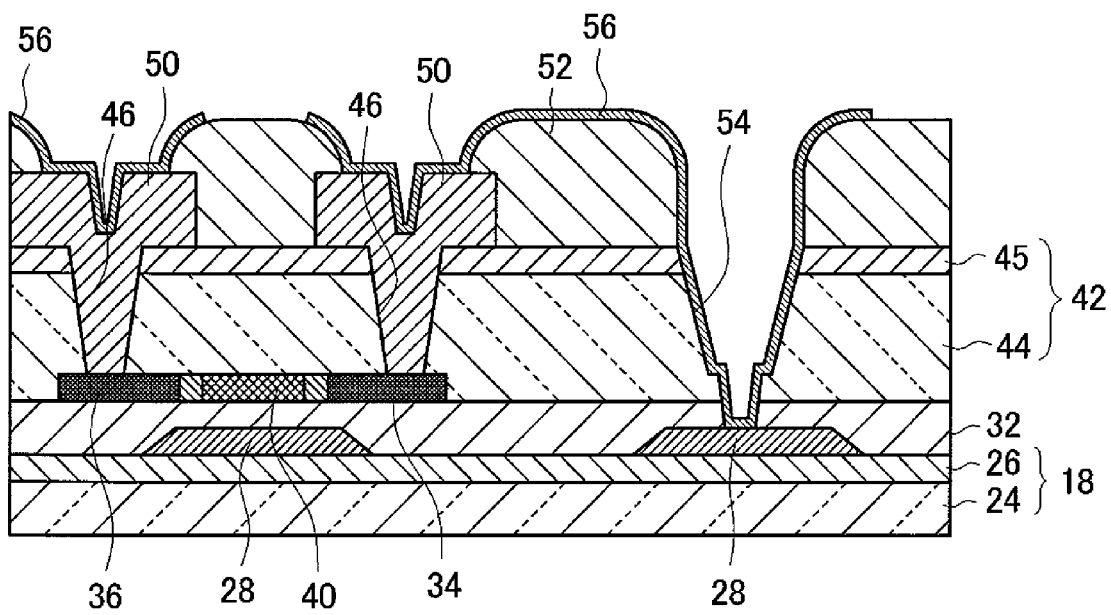
FIG. 12 is a view for explaining a manufacturing method of the display device to which the present invention is applied.

As shown in FIG. 12, a second line layer 56 is formed in the second contact hole 54. The second line layers 56 are formed such that the second line layer 56 reaches an upper surface of the first line layer 50 from a surface of the gate electrode 28 exposed from the second contact hole 54. The gate electrode 28 and the source region 34 or the drain region 36 are electrically connected to each other by the second line layer 56. Thereafter, by performing known treatments when necessary, a display device is obtained.

According to the embodiment of the present invention, what is formed above the gate electrodes 28 simultaneously with the formation of the first contact holes 46 is not a contact hole but the recessed portion 48 (see FIG. 10) and hence, the source region 34 and the drain region 36 are not largely influenced by the formation of the contact holes. Further, the first contact holes 46 and the recessed portion 48 are formed by dry etching and hence, side etching does not occur.

The display device includes the substrate 18 and the gate electrodes 28 which are formed on the substrate 18. The first insulation layer 32 formed of at least one layer is constituted of portions which cover the gate electrodes 28 and portions which do not overlap with the gate electrodes 28. The source region 34 and the drain region 36 are formed on the first insulation layer 32 at a position which avoids a region above at least a portion of the gate electrode 28.

The second insulation layer 42 is formed such that the second insulation layer 42 covers the gate electrodes 28 from above and covers the source regions 34 and the drain regions 36. The first contact holes 46 each of which reaches one of the source regions 34 and the drain regions 36 are formed in the second insulation layer 46. The second insulation layer 42 is formed by stacking a plurality of layers made of different materials from each other in a mutually contact manner. The first line layers 50 are formed such that each first line layer 50 covers each first contact hole 46.

The second contact holes 54 which reach the gate electrodes 28 are formed in the first and the second insulation layers 32, 42. As shown in FIG. 12, a stepped portion is formed on an inner surface of the second contact hole 54. The second line layer 56 is formed on the inner surface of the second contact hole 54 such that the second line layer 56 passes above the stepped portion.

Figure 13:
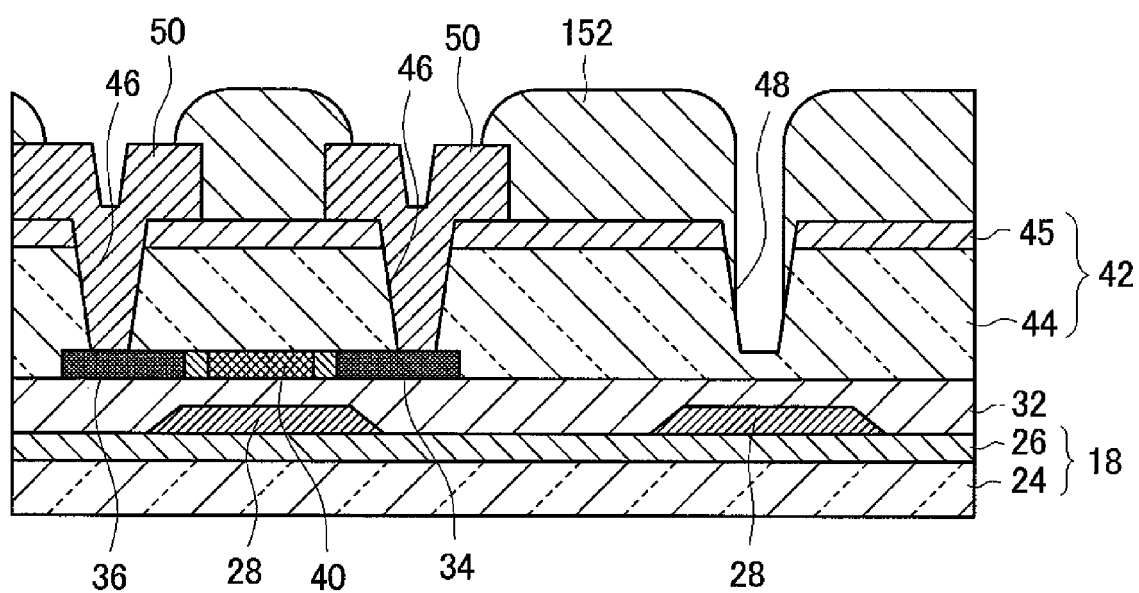
FIG. 13 is a view for explaining a modification of a manufacturing method of a display device according to an embodiment of the present invention.

FIG. 13 is a view for explaining a modification of the manufacturing method of the display device according to the embodiment of the present invention. In this modification, a third insulation layer 152 is formed such that the third insulation layer 152 reaches an inner surface of the recessed portion 48 while avoiding at least a portion of the bottom surface of the recessed portion 48. With respect to the other steps for manufacturing the display device, the corresponding steps explained in the above-mentioned embodiment are applicable.

The present invention is not limited to the above-mentioned embodiment and various modifications are conceivable. For example, the constitution explained in the above-mentioned embodiment may be replaced with the constitution which is substantially equal to the above-mentioned constitution, the constitution which can obtain the same manner of operation and advantageous effects as the above-mentioned constitution, or the constitution which can achieve the same object as the above-mentioned constitution.

What is claimed is:

1. A display device comprising:
a substrate;
gate electrodes which are formed on the substrate;
a first insulation layer which is formed on the substrate and is formed of at least one layer such that the first insulation layer includes portions which cover the gate electrodes and portions which do not overlap with the gate electrodes;
source regions and drain regions which are formed on the first insulation layer such that the source region and the drain region are arranged at positions which avoid an area above at least a portion of at least one of the gate electrodes;
a second insulation layer which is formed by stacking a plurality of layers made of different materials from each other in a mutually contact manner such that the second insulation layer covers respective ones of the gate electrodes from above and covers the source regions and the drain regions, and in which at least one of first contact holes which reaches at least one of the source regions and at least another of the first contact holes which reaches at least one of the drain regions are formed; and
first line layers which are formed such that each first line layer covers each first contact hole; wherein
at least one second contact hole which reaches the at least one of the gate electrodes is formed in the first and the second insulation layers,
a stepped portion is formed on an inner surface of the at least one second contact hole, and
a second line layer is formed on the inner surface of the at least one second contact hole such that the second line layer passes over the stepped portion.

2. A display device according to claim 1, wherein the second insulation layer includes a silicon oxide film and a silicon nitride film which is formed on the silicon oxide film.

3. A display device according to claim 1, wherein the inner surface of the at least one second contact hole consists of a first inner surface and a second inner surface, the first inner surface is an inner surface from the at least one of the gate electrodes to the stepped portion, the second inner surface is an inner surface from the stepped portion to an upper surface of the second insulation layer, and an inclination of the first inner surface is different from an inclination of the second inner surface.

4. A display device according to claim 3, wherein the first inner surface is steeper than the second inner surface.

* * * * *